United States Patent
Nahas et al.

(10) Patent No.: US 6,538,940 B1
(45) Date of Patent: Mar. 25, 2003

(54) METHOD AND CIRCUITRY FOR IDENTIFYING WEAK BITS IN AN MRAM

(75) Inventors: Joseph J. Nahas, Austin, TX (US); Thomas W. Andre, Austin, TX (US); Bradley J. Garni, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/255,303

(22) Filed: Sep. 26, 2002

(51) Int. Cl.$^7$ ................................ G11C 7/00
(52) U.S. Cl. ................ 365/201; 365/158; 365/207; 365/210
(58) Field of Search ................ 365/201, 158, 365/206, 207, 208, 210

(56) References Cited

U.S. PATENT DOCUMENTS

| | | | |
|---|---|---|---|
| 4,468,759 A | | 8/1984 | Kung et al. |
| 5,321,842 A | * | 6/1994 | Fairfield et al. ............... 712/43 |
| 5,537,358 A | | 7/1996 | Fong |
| 6,105,152 A | | 8/2000 | Duesman et al. |
| 6,128,239 A | * | 10/2000 | Perner ............... 365/209 |
| 6,385,111 B2 | * | 5/2002 | Tran et al. ............... 365/210 |
| 6,456,524 B1 | * | 9/2002 | Perner et al. ............... 365/158 |

* cited by examiner

Primary Examiner—Son T. Dinh
(74) Attorney, Agent, or Firm—Robert L. King; Joanna G. Chiu

(57) ABSTRACT

A memory (10, 60) having at least two resistance states is tested. In one form, the memory includes a first transistor (16, 68) having a current electrode coupled to a memory cell (14, 64) and a second transistor (26, 66) having a current electrode coupled to a reference memory cell (28, 74). The control electrode of the first transistor receives either a first reference voltage or a second reference voltage based on a test control signal, and the control electrode of a second transistor receives the first reference voltage. In a test mode, after the memory cell is programmed with a resistance state, the second reference voltage (different from the first reference voltage) is provided to the first transistor. The memory cell is then read to determine whether the memory can sense the previously programmed resistance state. In one embodiment, this test mode can be used to identify weak bits in the memory.

25 Claims, 3 Drawing Sheets

METHOD AND CIRCUITRY FOR IDENTIFYING WEAK BITS IN AN MRAM

RELATED APPLICATION

This application is related to:

U.S. patent application Ser. No. SC12180TC, entitled "Sense Amplifier For a Memory Having At Least Two Distinct Resistance States" by Nahas et al. filed Jun. 28, 2002, and assigned to the assignee hereof.

FIELD OF THE INVENTION

This invention relates generally to semiconductor circuits, and more specifically, to semiconductor memory circuits.

BACKGROUND OF THE INVENTION

A form of semiconductor memory that has at least two distinct resistance states is the magnetoresistive random access memory (hereinafter referred to as "MRAM"). A key factor in the reading of an MRAM cell is the resistance of the tunnel junction in the MRAM cell. With a large number of cells in a memory array, there will be a distribution of resistance values due to manufacturing processing variations. If the resistance of the tunnel junction is too high, a bit in the low resistance state will look like it is in the high resistance state. On the other hand, if the resistance of the tunnel junction is too low, a bit in the high resistance state will look like it is in the low resistance state. If such an error occurs consistently, ordinary testing of the memory will detect the problem. However, if the resistance value of a bit is borderline, then the bit, referred to as a weak bit, will sometimes be correctly read and sometimes incorrectly read due to noise during the testing. This variation can lead to a problem with memories that pass during production testing but that erratically fail when in use in a system.

Numerous testing methodologies have been previously proposed for DRAMs, SRAMs and Flash memories as the existence of weak bits is well documented in the memory literature. U.S. Pat. No. 4,468,759 entitled "Testing Method and Apparatus for DRAM" by Roger Kung et al. is an example of a test methodology for a DRAM. Kung discloses the adjustment of a stored voltage on a dummy DRAM cell that is used as a read reference for detecting weak bits. The voltage is raised for ones and lowered for zeroes. MRAMs, in contrast, store a magnetic state rather than a voltage. U.S. Pat. No. 5,537,358 by Fong entitled "Flash Memory having Adaptive Memory and Method" uses voltage variations on reference bits to compensate for weak bits. U.S. Pat. No. 6,105,152 entitled "Devices and Method for Testing Cell Margin of Memory Devices" by Kevin Duesman et al. is another example of a memory test methodology for identifying weak bits. In this example, during the testing, at least one of the start time, duration, or voltage levels of the timing signals is varied to be outside of specified ranges which results in borderline memory cells failing. This technique does not directly control or disclose by at what point a weak bit failure occurs.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
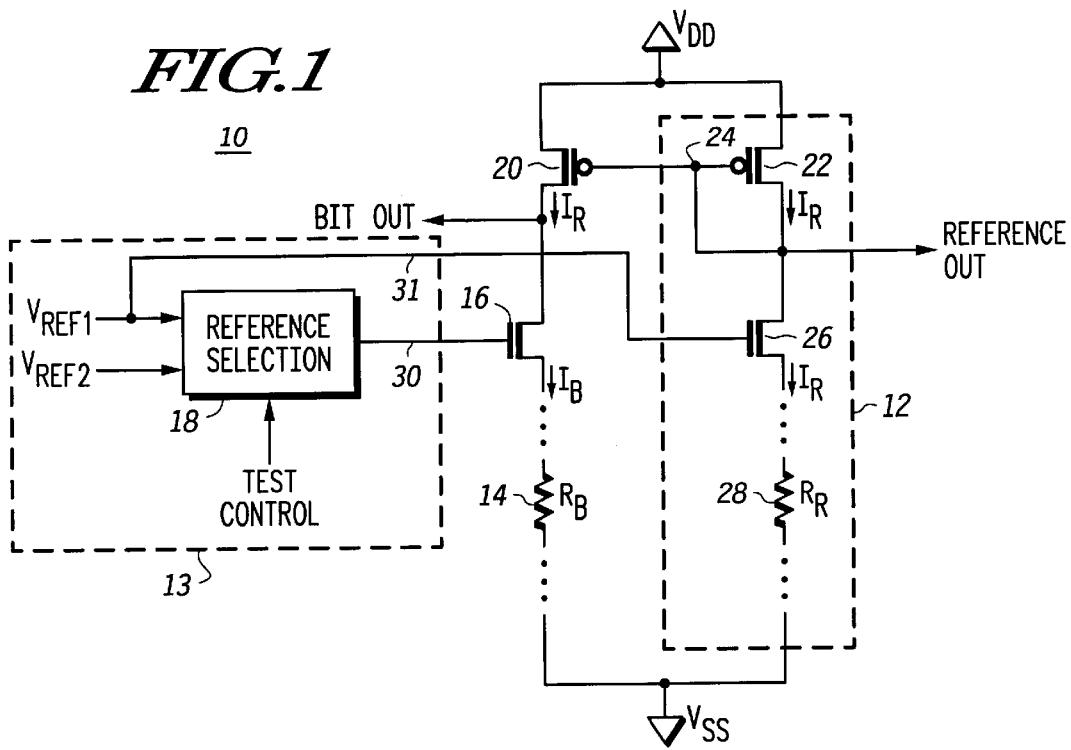
FIG. 1 illustrates in schematic form a portion of a memory having circuitry for identifying weak bits.

FIG. 1 illustrates a memory 10 having circuitry for identifying weak bits. Memory 10 is a memory having a plurality of cells, each having at least two distinct resistance states. A memory reference circuit 12, having a resistance $R_R$, is used in combination with a memory bit cell 14 to be tested, having a resistance of $R_B$. A first terminal of memory bit cell 14 is coupled as indicated by dots to a first reference voltage terminal for receiving a voltage $V_{SS}$. A second terminal of memory bit cell 14 is coupled as indicated by dots to a first current electrode in the form of a source of an N-channel transistor 16. All dots associated with the memory cells illustrated herein indicate that column and row select circuitry (not shown) is used to couple the memory cell between $V_{SS}$ and a sense amplifier formed of an N-channel transistor 16, a P-channel transistor 20, a P-channel transistor 22 and an N-channel transistor 26. Transistor 16 has a second current electrode in the form of a drain connected to a drain of transistor 20. Transistor 20 has a source connected to a power supply voltage terminal for receiving a voltage $V_{DD}$. A gate of transistor 20 is connected to a gate of transistor 22 at a node 24 that provides a Reference Out signal that is a reference output signal. A source of transistor 22 is connected to the $V_{DD}$ terminal. A drain of transistor 22 is connected to a drain of transistor 26 and to the gate of transistor 22. A gate of transistor 26 is connected to a node 31 in a Reference Circuit 13 for receiving a first reference voltage, $V_{REF1}$. A source of transistor 26 is coupled to a first terminal of a reference memory cell 28 having a resistance $R_R$. A second terminal of reference memory cell 28 is coupled to the $V_{SS}$ voltage terminal. A control electrode in the form of a gate of transistor 16 is connected to a reference signal of a Reference Selection circuit 18 of Reference Circuit 13 at a node 30. A first input of Reference Selection circuit 18 receives a first reference voltage, $V_{REF1}$, and a second input of Reference Selection circuit 18 receives a second reference voltage, $V_{REF2}$. A control input of Reference Selection circuit 18 receives a TEST CONTROL signal. The TEST CONTROL signal may assume, preferably, a first value or a second value for respectively selecting the $V_{REF1}$ and the $V_{REF2}$ reference voltages.

In a normal mode of operation, the TEST CONTROL signal is set so the $V_{REF1}$ voltage input is applied to node 30. Thus, the gates of transistors 16 and 26 have the same voltage applied thereto. Assume that the transistors 16 and 26 are physically sized the same with large gate width/length ratios so that the gate/source voltage can be approximated by the threshold voltage of the transistors 16 and 26. Thus the bit resistance $R_B$ and reference resistance $R_R$ have approximately the same voltage across their terminals. The bit resistance $R_B$ has a low resistance state and a high resistance state. The reference resistance $R_R$ has a resistance midway between the high resistance state and the low resistance state of $R_B$. The voltage across $R_R$ generates a current, $I_R$, that passes through transistor 26 and to node 24 and through transistor 22. The current $I_R$ conducted by transistor 22 determines the voltage on the gate and drain of transistor 22 as a result of transistor 22 being diode connected. Transistor 20 is connected to mirror the current $I_R$ conducted by transistor 22.

Assume that bit resistance $R_B$ is in the low resistance state. Then the bit current $I_B$ through memory cell 14 and transistor 16 will be larger than the current through reference cell 28, $I_R$. The net result is that the voltage on BIT OUT will be lower than the voltage on REFERENCE OUT indicating a low resistance state.

Similarly, assume that bit resistance $R_B$ is in the high resistance state. Then the bit current $I_B$ through memory cell 14 and transistor 16 will be smaller than the current through reference cell 28 $I_R$. The net result is that the voltage on BIT OUT will be higher than the voltage on REFERENCE OUT indicating a high resistance state.

Because of process variation, the bit resistance varies. Some bits in the low state may have a resistance value that is slightly less than or equal to the reference value and pass standard testing. Similarly, other bits in the high state may have a resistance near or slightly greater than the reference resistance thus marginally pass standard testing. To screen these weak bits, the TEST CONTROL signal enables a test mode such that the Reference Selection circuit 18 supplies $V_{REF2}$ to node 30. An appropriate value of $V_{REF2}$ causes weak bits to fail. Memory cell 14 may have a low state resistance value near the reference resistance value such that $I_B$ is only slightly more than $I_R$. Applying a value of $V_{REF2}$ less than $V_{REF1}$ will decrease $I_B$, thus $I_B$ for a weak bit is less than $I_R$ and the weak bit fails. Similarly, memory cell 14 may have a high state resistance value near the reference resistance value such that $I_B$ is only slightly greater than $I_R$. Applying a value of $V_{REF2}$ greater than $V_{REF1}$ will increase $I_B$, thus $I_B$ for a weak bit is greater than $I_R$ and the weak bit fails.

Figure 2:
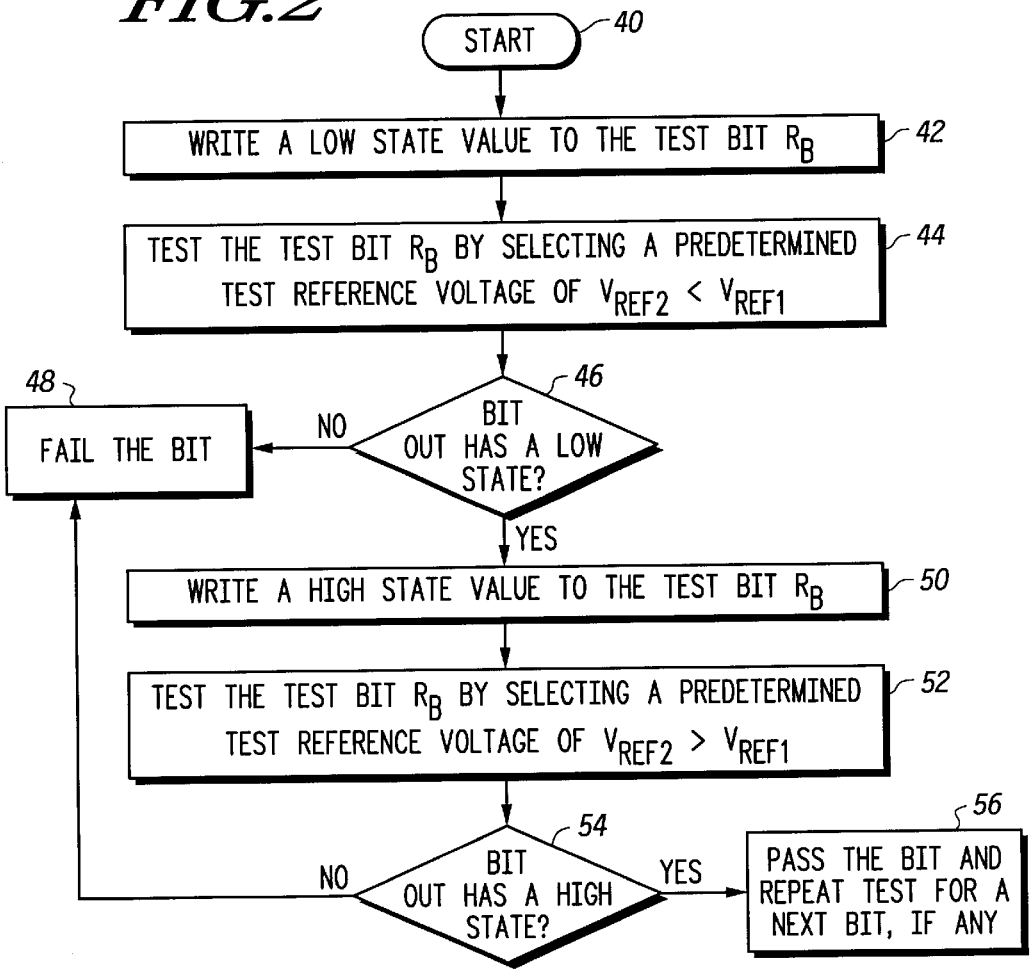
FIG. 2 illustrates in flow chart form a method for identifying weak bits in a memory in accordance with the present invention.

Illustrated in FIG. 2 is a flow chart of the test mode described above. After a start step 40, a low state value is written to the test bit $R_B$ in a step 42. In a step 44, the test bit $R_B$ is tested by selecting a predetermined test reference voltage of $V_{REF2}$ that is less in magnitude than $V_{REF1}$. If the BIT OUT signal is a logic high, memory cell 14 does not have a bit resistance of sufficient value to reliably read low value as determined in a step 46 and indicated in a step 48 where the bit is failed. If the BIT OUT signal provided at the drain of transistor 20 is a logic low, memory cell 14 has a bit resistance of sufficient value to reliably read a low value as determined in step 46. Assuming that the bit has not yet failed, in a step 50 a high state value is written to the test bit $R_B$. In a step 52, the test bit $R_B$ is tested by selecting a predetermined test reference voltage of $V_{REF2}$ that is greater in magnitude than $V_{REF1}$. If the BIT OUT signal is a logic low, memory cell 14 does not have a bit resistance of sufficient value to reliably read a high value as determined in a step 54 and indicated in a step 48 where the bit is failed. If the BIT OUT signal provided at the drain of transistor 20 is a logic high, memory cell 14 has a bit resistance of sufficient value to reliably read a high value. In a step 56, the bit is passed. The test may be repeated for additional memory cells, if any.

It should be noted that within steps 44 and 46, a determination may be made to repeat the test using various values for $V_{REF1}$ and $V_{REF2}$. In this manner, a sweep operation may be performed to determine exactly how close the memory cell value is to a marginal resistance. Similarly, steps 52 and 54 may be repeated using various values for $V_{REF1}$ and $V_{REF2}$.

Figure 3:
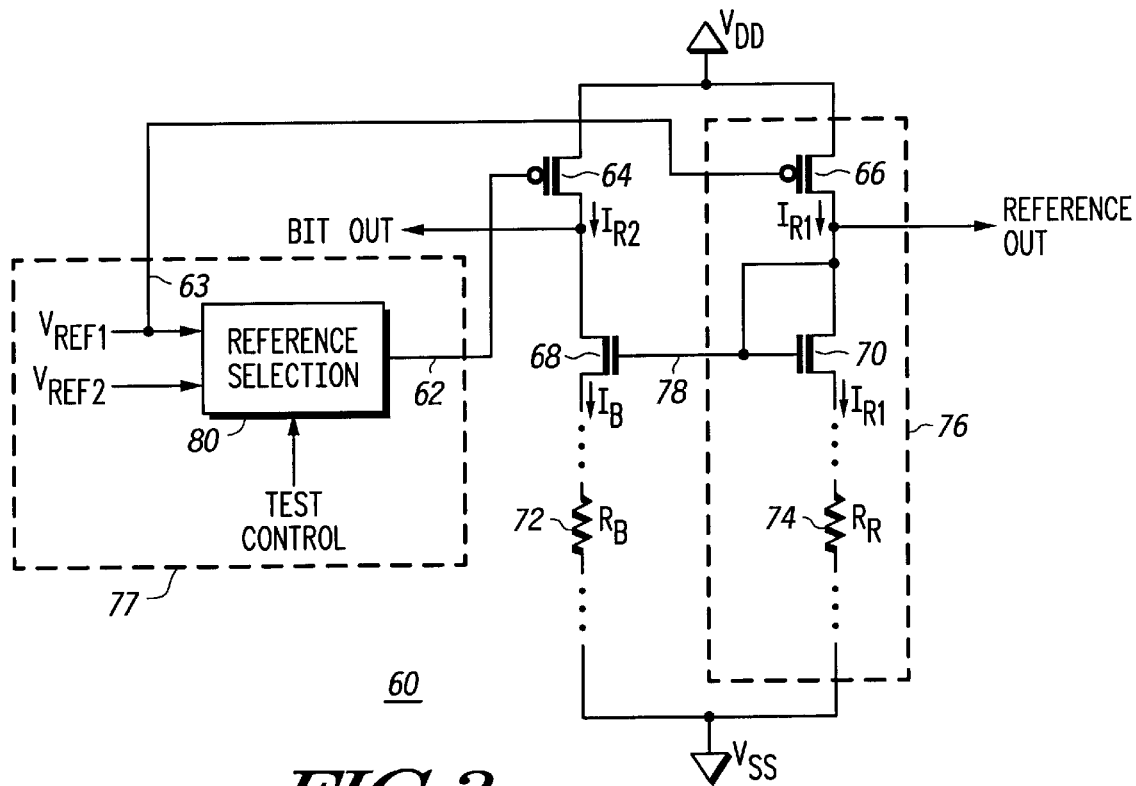
FIG. 3 illustrates in schematic form another embodiment of a portion of a memory having circuitry for identifying weak bits.

Illustrated in FIG. 3 is another memory, memory 60, having a different scheme for the sense amplifier wherein a common current is used rather than a common gate to accomplish biasing for the sense amplifier. A P-channel transistor 64 has a source connected to a $V_{DD}$ voltage terminal, and a gate connected at a node 62 to an output of a Reference Selection circuit 80 of Reference Circuit 77. A drain of transistor 64 provides a BIT OUT signal and is connected to a drain of an N-channel transistor 68. A source of transistor 68 is coupled to a first terminal of a memory cell 72 having a bit resistance of $R_B$. As mentioned previously, the source of transistor 68 may be directly connected to memory cell 72 or may be coupled via column select and/or row select circuitry. Similarly, a second terminal of memory cell 72 may be connected to a supply voltage terminal for receiving $V_{SS}$ or may be coupled via column select and/or row select circuitry. A P-channel transistor 66 has a source connected to a terminal for receiving $V_{DD}$. A gate of transistor 66 is connected to a node 63 in Reference Circuit 77 and to a first reference voltage $V_{REF1}$, and a drain of transistor 66 provides the REFERENCE OUT signal and is connected to both a gate and a drain of diode-connected N-channel transistor 70. The gate of transistor 70 is connected to a gate of transistor 68 at a node 78. A source of transistor 70 is coupled to a first terminal of a reference memory cell 74 having a reference resistance value of $R_R$. A memory reference circuit 76 is formed by transistor 66, transistor 70 and reference memory cell 74. A second terminal of reference memory cell 74 is coupled to the terminal for receiving the $V_{SS}$ supply voltage. The first terminal and the second terminal of reference memory cell 74 may be directly connected respectively to transistor 70 and the $V_{SS}$ supply voltage terminal or may be coupled via column select and/or row select circuitry (not shown). A first input of the Reference Selection circuit 80 is connected to the $V_{REF1}$ signal, and a second input of the Reference Selection circuit 80 is connected to a $V_{REF2}$ signal.

In operation, $V_{REF1}$ biases transistor 66 with a known voltage to establish a reference current $I_{R1}$ through transistor 66. The current $I_{R1}$ further biases diode connected transistor 70 establishing a voltage on node 78. The current $I_{R1}$ continues through transistor 70 to the reference memory cell 74. Assume that transistors 68 and 70 are physically sized the same with large gate width/length ratios so that the gate/source voltage can be approximated by the threshold voltage of the transistors 68 and 70. The voltage across reference memory cell 74 and bit cell 72 is approximately the same. The bit cell resistance $R_B$ generates a current $I_B$. In normal operation, the TEST CONTROL signal causes $V_{REF1}$ to be placed on node 62. Transistor 64 is designed to match transistor 66 so that in this case current $I_{R2}$ is the same as current $I_{R1}$. If the bit resistance $R_B$ is in the low state such that resistance $R_B$ is less than resistance $R_R$, then current $I_B$ will be greater than $I_{R1}$. The voltage at BIT OUT will be less than the voltage of the REFERENCE OUT signal. If on the other hand, the bit resistance $R_B$ is in the high state such that resistance $R_B$ is greater than resistance $R_R$, then current $I_B$ will be lower than $I_{R1}$. The voltage at BIT OUT will be greater than the voltage of the REFERENCE OUT signal.

Because of process variation the bit resistance varies. Some bits in the low state may have a resistance value that is slightly less than or equal to the reference value and passes standard testing. Similarly, other bits in the high state may have a resistance near or slightly greater than the reference resistance thus marginally passing standard testing. To screen these weak bits, the TEST CONTROL signal enables a test mode such that the Reference Selection circuit 80 supplies $V_{REF2}$ to node 62. An appropriate value of $V_{REF2}$ causes weak bits to fail. Memory cell 72 may have a low state resistance value near the reference resistance value such that $I_B$ is only slightly more than $I_{R2}$. Applying a value of $V_{REF2}$ less than $V_{REF1}$ will increase $I_{R2}$, thus $I_B$ for a weak bit will be less than $I_{R2}$ and the weak bit fails. Similarly, memory cell 72 may have a high state resistance value near the reference resistance value such that $I_B$ is only slightly less than $I_{R2}$. Applying a value of $V_{REF2}$ greater than $V_{REF1}$ will decrease $I_{R2}$, thus $I_B$ for a weak bit will be greater than $I_{R2}$ and the weak bit fails.

Figure 4:
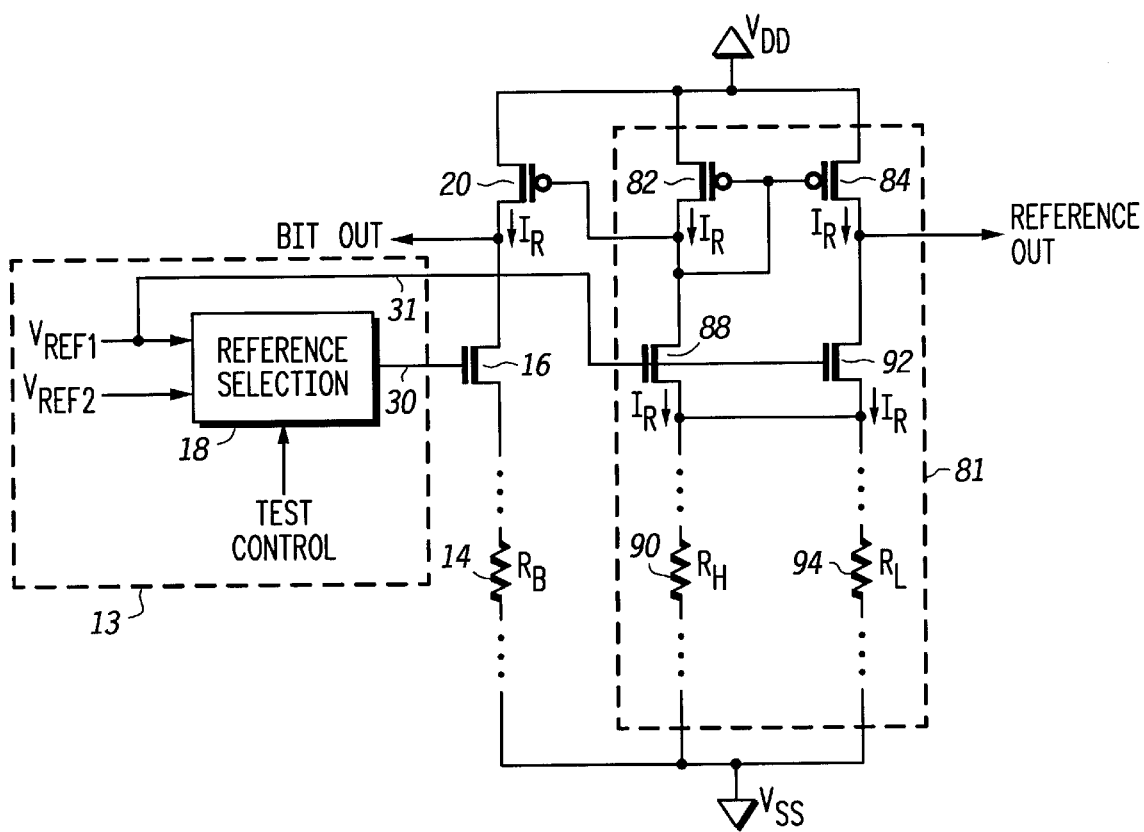
FIG. 4 illustrates in schematic form another embodiment of the memory of FIG. 1.

Illustrated in FIG. 4 is another form of memory 10 of FIG. 1. Elements that are common between FIG. 4 and FIG. 1 therefore have been similarly numbered for purposes of comparison. A memory reference circuit 81 has a P-channel transistor 82 having a source connected to a terminal for receiving supply voltage $V_{DD}$. A gate of transistor 82 is connected to a drain thereof and is connected to a gate of transistor 20 and to a gate of a P-channel transistor 84. A source of transistor 84 is connected to the terminal for receiving supply voltage $V_{DD}$. The drain of transistor 82 is connected to a drain of an N-channel transistor 88. The first reference voltage, $V_{REF1}$ and a node 31 of Reference Circuit 13 is connected to a gate of transistor 88 and to a gate of an N-channel transistor 92 that are connected together. A drain of transistor 84 is connected to a reference output terminal, REFERENCE OUT, and to a drain of transistor 92. Each of transistors 88 and 92 has its source connected together. The source of transistor 88 is coupled to a first terminal of a high reference memory cell 90 having a resistance $R_H$. A second terminal of reference memory cell 90 is coupled to the $V_{SS}$ voltage terminal. A source of transistor 92 is coupled to a first terminal of a low reference memory cell 94 having a resistance $R_L$. A second terminal of reference memory cell 94 is coupled to the $V_{SS}$ supply voltage terminal. Memory cells 90 and 94 are coupled between the $V_{SS}$ supply voltage terminal and transistors.88 and 92, respectively, by column select and row select circuitry (not shown) as indicated by the dotted lines. All remaining circuitry of the memory of FIG. 4 is connected as previously described for FIG. 1 and has the same element numbering.

In operation, memory reference circuit 81 performs a same function as the memory reference cell 12 of FIG. 1. In a normal mode of operation, the TEST CONTROL signal is set so the Vref1 voltage input is applied to node 30. Thus, the gates of transistors 16, 88 and 92 have the same voltage applied thereto. Assume that the transistors 16, 88 and 92 are physically sized the same with large gate width/length ratios so that the gate/source voltage can be approximated by the threshold voltage of the transistors 16, 88 and 92. Thus the bit resistance $R_B$ and reference resistances $R_H$ and $R_L$ have approximately the same voltage across their terminals. The bit resistance $R_B$ has a low resistance state and a high resistance state. The reference resistance $R_L$ is manufactured to be similar to the low resistance state of $R_B$ and the reference resistance $R_H$ is manufactured to be similar to the high resistance state of $R_B$. The voltage across the parallel combination of $R_L$ and $R_H$ generates a current, $2I_R$. Current $I_R$ passes through each of transistors 88 and 92. The current $I_R$ conducted by transistor 82 determines the voltage on the gate and drain of transistor 82 as a result of transistor 82 being diode connected. Transistors 20 and 84 are connected to mirror the current $I_R$ conducted by transistor 82.

Assume that bit resistance $R_B$ is in the low resistance state. Then the bit current $I_B$ through memory cell 14 and transistor 16 will be larger than the reference current $I_R$. The net result is that the voltage on BIT OUT will be lower than the voltage on REFERENCE OUT indicating a low resistance state.

Similarly, assume that bit resistance $R_B$ is in the high resistance state. Then the bit current $I_B$ through memory cell 14 and transistor 16 will be smaller than the reference current $I_R$ through reference cell 28. The net result is that the voltage on BIT OUT will be higher than the voltage on REFERENCE OUT indicating a high resistance state.

Because of process variation the bit resistance varies. Some bits in the low state may have a resistance value that is slightly less than or equal to the reference value and pass standard testing. Similarly, other bits in the high state may have a resistance near or slightly greater than the reference resistance thus marginally passing standard testing. To screen these weak bits, the TEST CONTROL signal enables a test mode such that the Reference Selection circuit 18 supplies $V_{REF2}$ to node 30. An appropriate value of $V_{REF2}$ causes weak bits to fail. Memory cell 14 may have a low state resistance value near the reference resistance value such that $I_B$ is only slightly more than $I_R$. Applying a value of $V_{REF2}$ less than $V_{REF1}$ will decrease $I_B$, thus $I_B$ for a weak bit is less than $I_R$ and the weak bit fails. Similarly, memory cell 14 may have a high state resistance value near the reference resistance value such that $I_B$ is only slightly greater than $I_R$. Applying a value of $V_{REF2}$ greater than $V_{REF1}$ will increase $I_B$, thus $I_B$ for a weak bit is greater than $I_R$ and the weak bit fails.

Figure 5:
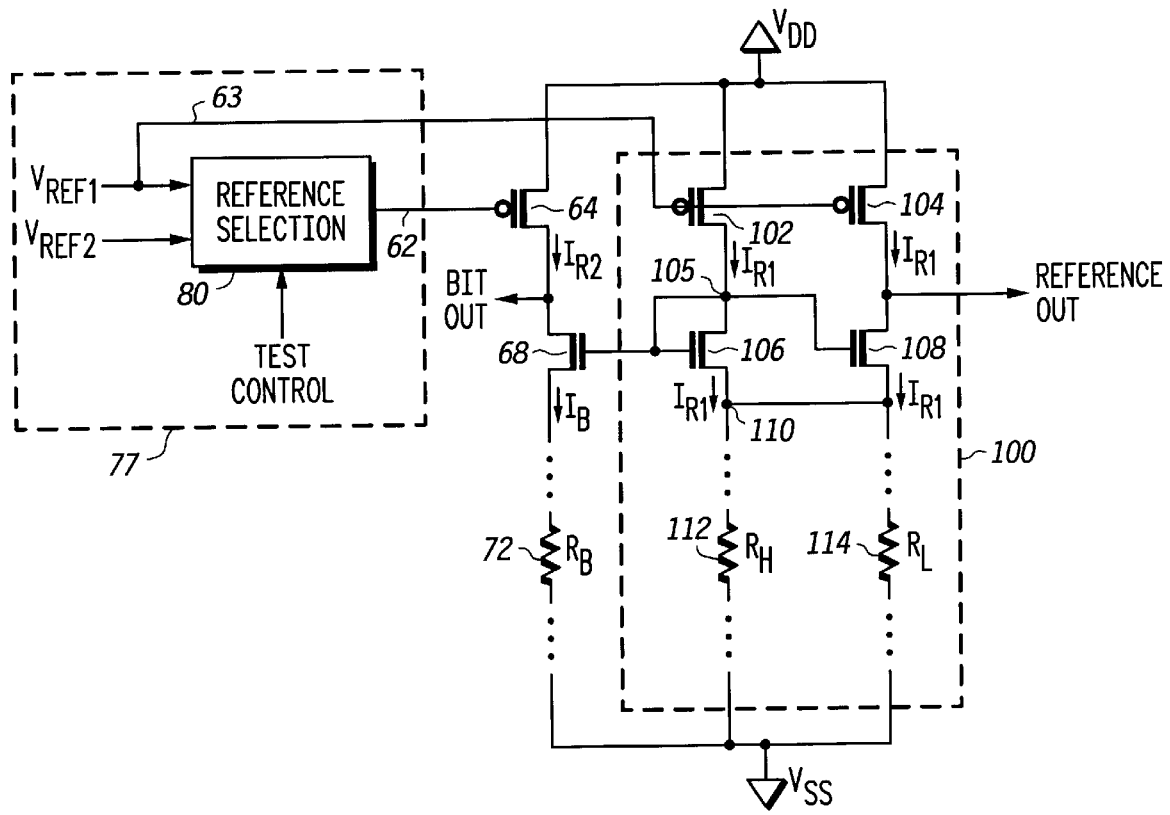
FIG. 5 illustrates in schematic form another embodiment of the memory of FIG. 3.

Illustrated in FIG. 5 is yet another form of memory 60 of FIG. 3. Elements that are common between FIG. 5 and FIG. 3 therefore have been similarly numbered for purposes of comparison. A memory reference circuit 100 has a P-channel transistor 102 having a source connected to a power supply voltage terminal for receiving supply voltage $V_{DD}$. A gate of transistor 102 is connected to a node 63 of a reference circuit 77 and to a first reference voltage, VREF1, and to a first input of the Reference Selection circuit 80. A drain of transistor 102 is connected to a drain of an N-channel transistor 106 at a node 105. A gate of transistor 106 is connected to the gate of transistor 68 and to the drain of transistor 106 at node 105. A source of transistor 106 is coupled to a first terminal of a reference memory cell 112 having a high resistive value $R_H$. The connection may be either direct or coupled via one or both of column select circuitry and row select circuitry (not shown). A second terminal of reference memory cell 112 is coupled via one or both of column select circuitry and row select circuit (not shown) or is directly connected to a reference voltage terminal for receiving a voltage $V_{SS}$. A source of a P-channel transistor 104 is connected to the power supply voltage terminal for receiving $V_{DD}$. A gate of transistor 104 is connected in common to the gate of transistor 102 and to the first reference voltage, $V_{REF1}$. A drain of transistor 104 provides a REFERENCE OUT signal and is connected to a drain of an N-channel transistor 108. A gate of transistor 108 is connected to node 105, and a source of transistor 108 is connected to the source of transistor 106 at a node 110. The source of transistor 108 is also coupled to a first terminal of a reference memory cell 114 having a low resistive value $R_L$. The connection may be either direct or coupled via one or both column select circuitry and row select circuitry (not shown). A second terminal of reference memory cell 114 is coupled via one or both of column select circuitry and row select circuitry (not shown) or is directly connected to the reference voltage terminal for receiving voltage $V_{SS}$.

In operation, $V_{REF1}$ biases transistors 102 and 104 with a known voltage to respectively establish equal reference currents $I_{R1}$ through transistors 102 and 104. The current $I_{R1}$ further biases diode connected transistor 106 establishing a voltage on node 105. The current $I_{R1}$ respectively continues through transistors 106 and 108 to the reference memory cells 112 and 114. Assume that transistors 68, 106 and 108 are physically sized the same with large gate width/length ratios so that the gate/source voltage can be approximated by the threshold voltage of the transistors 68, 106 and 108. The voltages across reference memory cells 112 and 114 and bit cell 72 are approximately the same. The bit cell resistance $R_B$ generates a current $I_B$. In normal operation, the TEST CONTROL signal causes $V_{REF1}$ to be placed on node 62. Transistor 64 is designed to match transistors 102 and 104 so that in this case current $I_{R2}$ is the same as current $I_{R1}$. If the bit resistance $R_B$ is in the low state such that resistance $R_B$ is less than the average of resistances $R_H$ and $R_L$, then current $I_B$ will be greater than $I_{R1}$. The voltage at BIT OUT will be less than the voltage of the REFERENCE OUT signal. If on the other hand, the bit resistance $R_B$ is in the high state such that resistance $R_B$ is greater than the average of resistances $R_H$ and $R_L$, then current $I_B$ will be lower than $I_{R1}$. The voltage at BIT OUT will be greater than the voltage of the REFERENCE OUT signal.

Because of process variation the bit resistance varies. Some bits in the low state may have a resistance value that is slightly less than or equal to the reference value and pass standard testing. Similarly, other bits in the high state may have a resistance near or slightly greater than the reference resistance thus marginally passing standard testing. To screen these weak bits, the TEST CONTROL signal enables a test mode such that the reference selection circuit 80 supplies $V_{REF2}$ to node 62. An appropriate value of $V_{REF2}$ causes weak bits to fail. Memory cell 72 may have a low state resistance value near the reference resistance value such that $I_B$ is only slightly more than $I_R$. Applying a value of $V_{REF2}$ less than $V_{REF1}$ will increase $I_{R2}$, and thus $I_B$ for the weak bit will be less than $I_{R2}$ and the weak bit will fail. Similarly, memory cell 72 may have a high state resistance value near the reference resistance value such that $I_B$ is only slightly less than $I_R$. Applying a value of $V_{REF2}$ greater than $V_{REF1}$ will decrease $I_{R2}$, and thus $I_B$ for the weak bit will be greater than $I_{R2}$ and the weak bit will fail.

Figure 6:
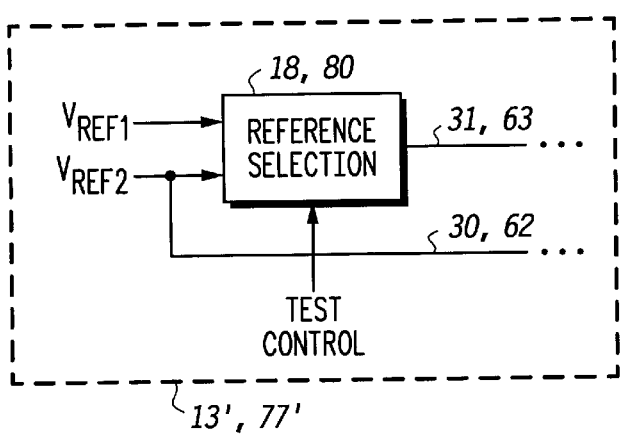
FIG. 6 illustrates in schematic form another embodiment of the reference circuit used in FIGS. 1, 3, 4 and 5.

Illustrated in FIG. 6 is an alternative form of the Reference Circuits 13 and 77 of FIGS. 1, 3, 4 and 5 designated as Reference Circuit 13' or 77'. A single figure is illustrated for convenience purposes rather than duplicating this alternative for each of FIGS. 1, 3, 4 and 5. Therefore, alternate reference numbers are present. The first reference voltage, $V_{REF1}$, is connected to a first input of Reference Selection circuit 18, 80. The second reference voltage, $V_{REF2}$, is connected to a second input of Reference Selection circuit 18, 80 and to node 30, 62. The output of Reference Selection Circuit 18, 80 is connected to node 31, 63. A test control signal, TEST CONTROL, is connected to a control terminal of Reference Selection Circuit 18, 80 for controlling whether input $V_{REF1}$ or input $V_{REF2}$ is placed on node 31, 63 by Reference Selection Circuit 18, 80.

In operation, this alternative form places the $V_{REF2}$ reference voltage on node 31, 63 and node 30, 62 in normal mode rather than placing $V_{REF1}$ on both node 31, 63 and node 30, 62 as is the case in FIGS. 1, 3, 4 and 5. In the test mode, VREF1 is placed on node 31, 63 and VREF2 is placed on node 30, 62 as is the case described above in FIGS. 1, 3, 4 and 5. Therefore, operationally the function is the same in the test mode for each embodiment as explained above.

By now it should be appreciated that there has been provided a memory having cells with at least two distinct resistive states, such as an MRAM, and circuitry used to identify weak bits that may provide inaccurate values when read. By using differing reference voltages within a sense amplifier, the indication may be accomplished without use of external factors, such as temperature and supply voltage variations, and without having to modify the timing and clock signals of the memory. In the illustrated form, the method provided herein causes the sense amplifier to be unbalanced under control of logic circuitry and a second reference voltage or current. As a result, the memory test circuitry provided herein enables improved reliability in operation and minimizes the presence of spurious weak bit errors exemplified by previously known methods. The detection of borderline resistance bits made possible by the present invention results in a reliable memory that will not generate errors due to the presence of weak memory cell bits.

Once weak bits are identified, the memory may be repaired by using memory redundancy. Depending upon the number of weak bits identified, the memory may be repaired via redundancy, or if there is insufficient redundancy remaining, the memory may be failed.

It should be well understood that the reference voltage selection circuitry provided by Reference Selection circuits 18 and 80 herein may be implemented either as a multiplexor circuit or by using various logic circuits to implement the function of providing one of two reference voltages of predetermined value in response to a control signal.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, the circuit implementation of the sense amplifier that is used with the reference selection circuitry taught herein may be varied and function in various methods to perform data sensing. Although MOSFETs of specific conductivity type are illustrated, it should be well understood that changes in the conductivity type by switching a first conductivity type (N-channel) to a second conductivity type (P-channel) and vice versa or changes in the type of transistors may be made to implement the interconnect structures. Memories implemented with various magnetoresistive random access memory structures may be used. The type of operation required to program and read the magnetoresistive random access memory may vary and be used with the method taught herein. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A memory having at least two resistance states, comprising:

a memory cell;

a first reference memory cell;

reference voltage selection circuitry having a first input to receive a first reference voltage, a second input to receive a second reference voltage, a third input to receive a control signal, and an output to provide one of the first reference voltage or the second reference voltage based on the control signal;

a first transistor, of a first conductivity type, having a first current electrode coupled to the memory cell, a second current electrode, and a control electrode coupled to the output of the reference voltage selection circuitry for receiving the one of the first reference voltage or the second reference voltage;

a second transistor, of a second conductivity type, having a first current electrode coupled to the second current electrode of the first transistor, a second current electrode coupled to a first voltage terminal, and a control electrode;

a third transistor, of the first conductivity type, having a first current electrode coupled to the first reference memory cell, a control electrode coupled to receive the first reference voltage, and a second current electrode; and a fourth transistor, of the second conductivity type, having a first current electrode coupled to the second current electrode of the third transistor, a control electrode coupled to the first current electrode of the fourth transistor and to the control electrode of the second transistor, and a second current electrode coupled to the first voltage terminal.

2. The memory of claim 1, further comprising:

a second reference memory cell;

a fifth transistor, of the first conductivity type, having a first current electrode coupled to the second reference memory cell and to the first current electrode of the third transistor, a control electrode coupled to the control electrode of the third transistor, and a second current electrode; and a sixth transistor, of the second conductivity type, having a first current electrode coupled to the second current electrode of the fifth transistor, a control electrode coupled to the control electrode of the fourth transistor, and a second current electrode coupled to the first voltage terminal.

3. The memory of claim 2, wherein the memory cell is programmable to either a high resistance state or a low resistance state, the first reference memory cell is programmed to the high resistance state, and the second reference memory cell is programmed to the low resistance state.

4. The memory of claim 1, wherein the reference voltage selection circuitry provides the first reference voltage to the control electrode of the first transistor when the control signal has a first value and the second reference voltage to the control electrode of the first transistor when the control signal has a second value.

5. The memory of claim 1, wherein the memory cell is programmable to either a high resistance state or a low resistance state, and the first reference memory cell is programmed to a predetermined resistance.

6. The memory of claim 5, wherein the predetermined resistance is a value different from both the high resistance state and the low resistance state.

7. The memory of claim 1, wherein the second reference voltage has a value different from the first reference voltage.

8. The memory of claim 1, wherein the second current electrode of the first transistor provides an output signal, and the second current electrode of the third transistor provides a reference output signal.

9. A memory having at least two resistance states, comprising:

a memory cell;

a first reference memory cell;

reference voltage selection circuitry having a first input to receive a first reference voltage, a second input to receive a second reference voltage, a third input to receive a control signal, and an output to provide one of the first reference voltage or the second reference voltage based on the control signal;

a first transistor, of a first conductivity type, having a first current electrode coupled to the memory cell, a second current electrode, and a control electrode;

a second transistor, of a second conductivity type, having a first current electrode coupled to the second current electrode of the first transistor, a second current electrode coupled to a first voltage terminal, and a control electrode coupled to the output of the reference voltage selection circuitry for receiving the one of the first reference voltage or the second reference voltage;

a third transistor, of the first conductivity type, having a first current electrode coupled to the first reference memory cell, a second current electrode, and a control electrode coupled to the second current electrode of the third transistor and to the control electrode of the first transistor; and a fourth transistor, of the second conductivity type, having a first current electrode coupled to the second current electrode of the third transistor, a control electrode coupled to receive the first reference voltage, and a second current electrode coupled to the first voltage terminal.

10. The memory of claim 9, further comprising:

a second reference memory cell;

a fifth transistor, of the first conductivity type, having a first current electrode coupled to the second reference memory cell and the first current electrode of the third transistor, a control electrode coupled to the control electrode of the third transistor, and a second current electrode; and a sixth transistor, of the second conductivity type, having a first current electrode coupled to the second current electrode of the fifth transistor, a control electrode coupled to receive the first reference voltage, and a second current electrode coupled to the first voltage terminal.

11. The memory of claim 10, wherein the memory cell is programmable to either a high resistance state or a low resistance state, the first reference memory cell is programmed to the high resistance state, and the second reference memory cell is programmed to the low resistance state.

12. The memory of claim 9, wherein the reference voltage selection circuitry provides the first reference voltage to the control electrode of the second transistor when the control signal has a first state and the second reference voltage to the control electrode of the second transistor when the control signal has a second state.

13. The memory of claim 9, wherein the memory cell is programmable to either a high resistance state or a low resistance state, and the first reference memory cell is programmed to a predetermined resistance.

14. The memory of claim 13, wherein the predetermined resistance is a value between the high resistance state and the low resistance state.

15. The memory of claim 9, wherein the second reference voltage has a value different from the first voltage reference.

16. A method for testing a memory having at least two resistance states, wherein the memory includes a memory cell programmable to any of the at least two resistance states, a first transistor having a first current electrode coupled to the memory cell, a second current electrode coupled to a voltage terminal, and a control electrode, a reference memory cell programmed to a predetermined resistance, and a second transistor having a first current electrode coupled to the reference memory cell, a second current electrode coupled to the voltage terminal, and a control electrode, the method comprising:
  writing a first one of the at least two resistance states to the memory cell;
  providing a first reference voltage value to the control electrode of the second transistor and a second reference voltage value, different from the first reference voltage value, to the control electrode of the first transistor; and
  after providing the first and second reference voltage values, determining whether the memory cell is programmed to the first one of the at least two resistance states.

17. The method of claim 16, wherein the memory further includes:
  a third transistor coupled between the first transistor and the voltage terminal, the third transistor having a first current electrode coupled to the second current electrode of the first transistor, a second current electrode coupled to the voltage terminal, and a control electrode; and
  a fourth transistor coupled between the second transistor and the voltage terminal, the fourth transistor having a first current electrode coupled to the second current electrode of the second transistor, and a second current electrode coupled to the voltage terminal, and a control electrode coupled to the control electrode of the third transistor and the first current electrode of the fourth transistor.

18. The method of claim 17, wherein the first and second transistors have a first conductivity type, and the third and fourth transistors have a second conductivity type.

19. The method of claim 16, wherein the memory further includes:
  a third transistor coupled between the first transistor and the memory cell, the third transistor having a first current electrode coupled to the memory cell, a second current electrode coupled to the first current electrode of the first transistor, and a control electrode; and
  a fourth transistor coupled between the second transistor and the reference memory cell, the fourth transistor having a first current electrode coupled to the reference memory cell, and a second current electrode coupled to the first current electrode of the second transistor, and a control electrode coupled to the control electrode of the third transistor and the second current electrode of the fourth transistor.

20. The method of claim 19, wherein the first and second transistors have a first conductivity type, and the third and fourth transistors have a second conductivity type.

21. The method of claim 16, after determining whether the memory cell is programmed to the first one of the at least two resistance states, further comprising:
  modifying the second reference voltage value to generate a modified second reference voltage value;
  providing the modified second reference voltage value, different from the first reference voltage value, to the control electrode of the first transistor; and
  after providing the modified second reference voltage value, determining whether the memory cell is programmed to the first one of the at least two resistance states.

22. The method of claim 16, further comprising:
  writing a second one of the at least two resistance states to the memory cell;
  providing the first reference voltage value to the control electrode of the second transistor;
  providing a third reference voltage value, different from the first and second reference voltage values, to the control electrode of the first transistor; and
  after providing the first and third reference voltage values, determining whether the memory cell is programmed to the second one of the at least two resistance states.

23. The method of claim 16, wherein the at least two resistance states comprise a high resistance state and a low resistance state, and wherein when the first one of the at least two resistance states is the low resistance state, the second reference voltage value is less than the first reference voltage value and when the first one of the at least two resistance states is the high resistance state, the second reference voltage value is greater than the first reference voltage value.

24. A memory having at least two resistance states, comprising:
  a memory cell;
  a first reference memory cell;
  reference voltage selection circuitry having a first input to receive a first reference voltage, a second input to receive a second reference voltage, a third input to receive a control signal, and an output to provide one of the first reference voltage or the second reference voltage based on the control signal;
  a first transistor, of a first conductivity type, having a first current electrode coupled to the memory cell, a second current electrode, and a control electrode coupled to receive the first reference voltage;
  a second transistor, of a second conductivity type, having a first current electrode coupled to the second current electrode of the first transistor, a second current electrode coupled to a first voltage terminal, and a control electrode;

a third transistor, of the first conductivity type, having a first current electrode coupled to the first reference memory cell, a control electrode coupled to the output of the reference voltage selection circuitry for receiving the one of the first reference voltage or the second reference voltage, and a second current electrode; and a fourth transistor, of the second conductivity type, having a first current electrode coupled to the second current electrode of the third transistor, a control electrode coupled to the first current electrode of the fourth transistor and to the control electrode of the second transistor, and a second current electrode coupled to the first voltage terminal.

25. A memory having at least two resistance states, comprising:

a memory cell;

a first reference memory cell;

reference voltage selection circuitry having a first input to receive a first reference voltage, a second input to receive a second reference voltage, a third input to receive a control signal, and an output to provide one of the first reference voltage or the second reference voltage based on the control signal;

a first transistor, of a first conductivity type, having a first current electrode coupled to the memory cell, a second current electrode, and a control electrode;

a second transistor, of a second conductivity type, having a first current electrode coupled to the second current electrode of the first transistor, a second current electrode coupled to a first voltage terminal, and a control electrode coupled to receive the first reference voltage;

a third transistor, of the first conductivity type, having a first current electrode coupled to the first reference memory cell, a second current electrode, and a control electrode coupled to the second current electrode of the third transistor and to the control electrode of the first transistor; and a fourth transistor, of the second conductivity type, having a first current electrode coupled to the second current electrode of the third transistor, a control electrode coupled to the output of the reference voltage selection circuitry for receiving the one of the first reference voltage or the second reference voltage, and a second current electrode coupled to the first voltage terminal.

* * * * *